US012772417B1

(12) United States Patent
Huynh et al.

(10) Patent No.: US 12,772,417 B1
(45) Date of Patent: Oct. 20, 2026

(54) RACK-BASED SYSTEM WITH COOLANT CONNECTOR ALIGNMENT ASSEMBLY

(71) Applicant: Amazon Technologies, Inc., Seattle, WA (US)

(72) Inventors: Kenny Kiet Huynh, Lynnwood, WA (US); William Mark Megarity, Bonney Lake, WA (US); Matthew Atilano, Stanwood, WA (US); Andrew Charles Crain, Everett, WA (US); Chetan Sanjay Agarwal, Seattle, WA (US); Gregory Martin Albright, Bellevue, WA (US); Bradley David Urban, Bainbridge Island, WA (US)

(73) Assignee: Amazon Technologies, Inc., Seattle, WA (US)

( * ) Notice: Subject to any disclaimer, the term of this patent is extended or adjusted under 35 U.S.C. 154(b) by 288 days.

(21) Appl. No.: 18/749,396

(22) Filed: Jun. 20, 2024

(51) Int. Cl.
*H05K 7/20* (2006.01)

(52) U.S. Cl.
CPC ..... *H05K 7/20272* (2013.01); *H05K 7/20781* (2013.01)

(58) Field of Classification Search
CPC ....................... H05K 7/20272; H05K 7/20781
USPC ..................................................... 361/679.53
See application file for complete search history.

(56) References Cited

U.S. PATENT DOCUMENTS

| | | | | | |
|---|---|---|---|---|---|
| 4,815,986 | A * | 3/1989 | Dholoo | H01R 13/631 439/248 |
| 5,391,091 | A * | 2/1995 | Nations | H01R 12/7047 439/378 |
| 11,381,044 | B2 * | 7/2022 | Bednarz | H01R 12/91 |
| 11,831,103 | B1 * | 11/2023 | Feister | F16L 37/62 |
| 2021/0378124 | A1 * | 12/2021 | Shao | H05K 7/1488 |
| 2022/0412496 | A1 * | 12/2022 | Nick | F16L 37/52 |

* cited by examiner

*Primary Examiner* — Zhengfu J Feng
(74) *Attorney, Agent, or Firm* — Kilpatrick Townsend & Stockton LLP

(57) ABSTRACT

A system can include an alignment assembly configured to be implemented relative to a rack-mountable chassis. The alignment assembly can include a collar sized to receive a cylindrical body of an adapter in a received position in which a fitting of the adapter and a coolant connector of the adapter are arranged extending away from opposite sides of the collar. A housing may contain the collar and include landing surfaces arranged for receiving a set of biasing members to press against the landing surfaces and impart biasing forces directed at least partially radially toward the collar. A guide block may be moveable relative the housing and include a bore sized for being received on the adapter in the received position. The guide block may be accompanied by a tapered surface engageable by axial translation to cause radial translation of the collar counter to at least some of the biasing members.

20 Claims, 5 Drawing Sheets

RACK-BASED SYSTEM WITH COOLANT CONNECTOR ALIGNMENT ASSEMBLY

BACKGROUND

Datacenters contain large amounts of computing equipment, which can include servers and networking hardware such as switches and routers. One important consideration for datacenters is how to effectively cool computing equipment components to reduce risks of equipment failure that may make computing resources unavailable. Liquid-cooled systems can be used, but such systems may present challenges with effectively establishing, maintaining, and/or releasing connections between different liquid paths, especially when components of the computing system may be arranged for sliding apart and/or into engagement during installation, maintenance, or other servicing activities.

BRIEF DESCRIPTION OF THE DRAWINGS

Various embodiments in accordance with the present disclosure will be described with reference to the drawings, in which.

DETAILED DESCRIPTION

Technologies described herein may relate to alignment assemblies that facilitate alignment for establishing connections among liquid paths, such as may be implemented in liquid cooling systems for a chassis that may be slidable relative to a rack. For example, an individual chassis may include a server or other computing equipment component that is supplied with coolant by a conduit through the chassis. The conduit may be connected via a connector to a fluid supply line that may also supply components in one or more other chassis received within a given rack. The connector that provides the interface between the conduit of the chassis and the supply line of the rack may be, for example, an anti-leak and/or quick-disconnect connector. The connector may be supported in a collar that may be positioned among a set of biasing members, which may be oriented radially around an outer surface of the collar. The biasing members may permit the collar to undergo beneficial radial displacement. For example, in use, the biasing members and collar may smooth movement in a radially outward direction when the connector is being aligned for engagement and/or may impart a radially inward movement to re-center when the connector is disengaged.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Figure 1:
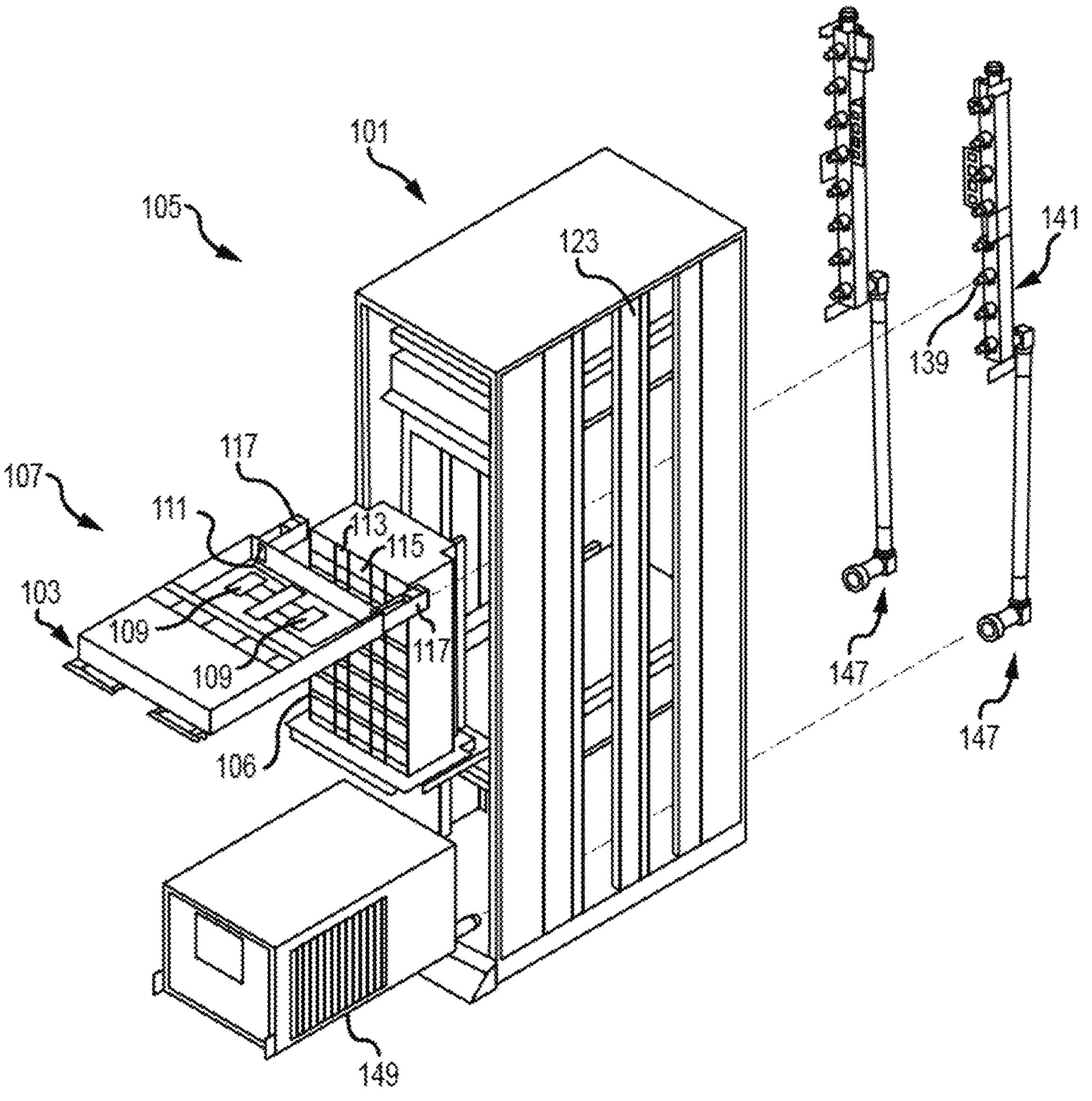
FIG. 1 is a perspective view of a rack and associated components that may be used within a datacenter according to various embodiments.

FIG. 1 is a perspective view of a rack 101 and associated components that may be used within a datacenter according to various embodiments. The rack 101 can support any number of chassis 103. For example, although one chassis 103 is shown in FIG. 1 for ease of viewing, any other number could be used, including eight chassis 103, between one and seven, or nine or more.

The rack 101 and/or the chassis 103 may be implemented relative to a system 105. The system 105 may include the rack 101, the chassis 103, and/or other components. Various components of the system 105 are shown in exploded view in FIG. 1 for ease of viewing associated structures, although components may be received in and/or along the rack 101 in use.

The system 105 may include components of other systems or subsystems.

Suitable components of a cooling system 107 can be included. The cooling system 107 may provide coolant or otherwise provide cooling to components in the chassis 103 within the rack. The coolant may include water or other liquid coolant, for example. Components of the cooling system 107 may be located in or on the rack 101, in or on the chassis 103, or remote and/or separate from both the rack 101 and chassis 103.

The chassis 103 can include and/or interact with other components. The chassis 103 is depicted implemented with an appliance 109, a coolant conduit 111, a power connector 113, a data connector 115, and a coolant connector 117, although more, fewer, and/or other components may be implemented. The power connector 113 and the data connector 115 are depicted as structures on a midplane 106 that may provide connection to other structures coupled with the midplane 106, although the power connector 113 and/or the data connector 115 may correspond to structures in or on the chassis 103 or otherwise arranged to enable communication or interoperability among components in the chassis 103 and other components received in the rack 101 and/or remote from the rack 101.

The appliance 109 may correspond to one or more parts of a computer server, or any other computing equipment component. Examples may include heat-generating or other components that may be borne by the chassis 103. The heat-generating components may correspond to integrated circuits (including chips or dice), or other heat-generating components. Non-limiting examples include a processor, an input/output (I/O) chip, a baseboard management controller, a chip, a die, a card (e.g., which may include a printed circuit board various that bears other components), a voltage regulator, a hot swap control, an inductor, a resistor, or a capacitor). Other non-limiting examples may include a Field Programmable Gate Array (FPGA), a Complex Programmable Logic Device (CPLD), and a System-on-a-Chip (SoC). Each heat-generating component may include one or more subcomponents that generate heat to be carried away or otherwise addressed by the cooling system 107. For example, the coolant conduit 111 of the cooling system 107 may be arranged to provide coolant flow over, by, and/or past the appliance 109 (such as by supplying coolant through cooling plates, heat exchangers, or other suitable structure for absorbing and/or carrying away heat from such heat-generating components).

Various elements of the chassis 103 may facilitate connection of the chassis 103 when the chassis 103 is fully received within the rack 101, such as when the chassis 103 has been moved from an extended position to a seated position. For example, in various embodiments, blind mate connectors may be utilized. Blind mate connectors may allow connection to be established by the act of receiving the chassis 103 or installing the chassis 103 within the rack 101. Any of the power connector 113, the data connector 115, and/or the coolant connector 117 may utilize blind mate connectors. However, in some embodiments, some components may be arranged to be manually connected following installation of the chassis 103 in lieu of or in addition to using blind mate connectors to automatically connect to the chassis 103 upon installation. In various embodiments, installing the chassis 103 within the rack 101 can involve sliding the chassis 103 along a set of one or more rails that are supported by vertical struts 123 of the rack 101 until the chassis 103 is slidingly received in the rack 101. However, other suitable structures may be utilized for facilitating sliding or other movement of the chassis 103 relative to the rack 101 including, but not limited to, bearing elements that may include polished surfaces and/or ball bearings or any other structures suitable for facilitating sliding.

The power connector 113 can correspond to any structure for establishing a power connection. Some examples may include, but are not limited to, a plug with a set of prongs and/or a corresponding socket for receiving the prongs. The power connector 113 may provide connection to a power cable, a power conduit, a power supply unit, a power harness structure, and/or another source of electrical power. The power connector 113 can be coupled with any appropriate wires, traces, or other structures for conveying power from the power connector 113 to the appliance 109 and/or other components of the chassis 103.

The data connector 115 can correspond to any structure capable of establishing a connection for communicating data from, to, or relative to the chassis 103 or components therein. The data connector 115 may form a part of a data connection interface. Suitable examples of types of the data connection interface may include pluggable optical transceivers (such as small form-factor pluggable (SFP), enhanced small form-factor pluggable (SFP+), compact small form-factor pluggable (CSFP), or other variations such as QSFP, QSFP+, QSFP28, QSFP56, QSFP56-DD, or OSFP), interconnect interfaces (such as Ultra path Interconnect (UPI), peripheral component interconnect express (PCIE), an RJ45 connector type or a similar connector type, or a connector sized and arranged to meet any other suitable standards that may be implemented. The data connector 115 may convey data to or from other elements in the rack 101 and/or to or from components that are remote from the rack 101.

The coolant connector 117 can correspond to any suitable structure for establishing a connection through which coolant can be conveyed. The coolant connector 117 may be arranged to engage a port body 139. The coolant connector 117 on the chassis 103 and the port body 139 can together form parts of a coolant connection interface 141. The coolant connection interface 141 may correspond to an anti-leak connection interface. For example, the structures of the coolant connection interface may be arranged to cut off coolant supply when the coolant connector 117 of the chassis 103 is disconnected from the port body 139. Suitable examples may include quick-disconnect or quick-release couplings or fittings that may be commercially available.

The cooling system 107 can include a coolant manifold 147. The port body 139 may be coupled with or form a part of a coolant manifold 147, for example. The coolant manifold 147 may be connected to a coolant module 149, for example, to provide coolant to multiple chassis 103 within the rack 101. The coolant module 149 may correspond to a coolant distribution unit and/or may include suitable heat exchangers, pumps, or other structures for circulating coolant relative to components in a chassis 103 or multiple chassis 103. As an illustrative example in FIG. 1, coolant may flow up through a coolant manifold 147 depicted at the left side of the rack 101 in FIG. 1, through a coolant conduit 111 and two appliances 109 in the chassis 103, and then out and down a second coolant manifold 147 depicted at the right side of the rack 101 in FIG. 1. Other arrangements are also possible, for example, including an arrangement in which coolant is circulated through only one appliance 109 or through more than two appliances 109. As another example, coolant may flow in one coolant connection interface 141 and out through another coolant connection interface on the same side of the chassis 103, for example, if a coolant manifold 147 includes multiple passages in it for circulating coolant.

Suitable structure may be included for facilitating connection among components of the cooling system 107. Some examples are shown in greater detail in FIG. 2.

Figure 2:
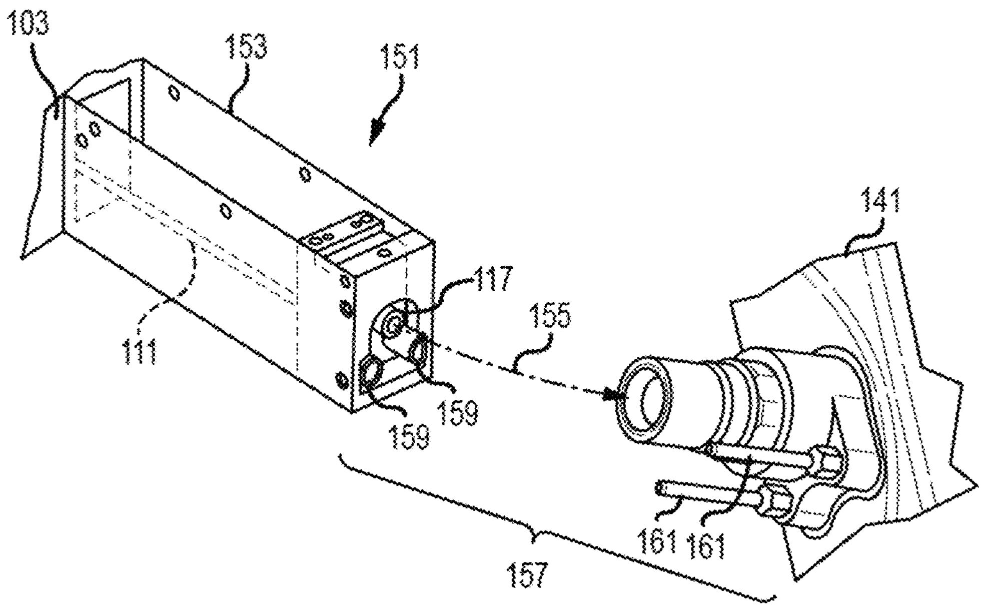
FIG. 2 illustrates an enlarged view of some components that may be used with the rack of FIG. 1 according to various embodiments.

FIG. 2 illustrates an enlarged view of some components that may be used with the rack 101 of FIG. 1 according to various embodiments. In particular, the coolant connector 117, the coolant conduit 111, and the port body 139 are shown accompanied by other components in FIG. 2.

An alignment assembly 151 may be included. The alignment assembly 151 may be configured to be borne by the chassis 103. For example, the alignment assembly 151 is shown received in a rearwardly extending arm 153 of the chassis 103 (e.g., which may permit connection with the port body 139 rearward of the midplane 106 in FIG. 1), although the alignment assembly 151 may be otherwise installed along a rear margin or other suitable location of the chassis 103. The alignment assembly 151 may be installed in a position arranged to facilitate alignment between the coolant conduit 111 and the coolant manifold 147. For example, in use, the alignment assembly 151 may be utilized to facilitate establishing connection between the coolant connector 117 and the port body 139 (e.g., as illustrated by the arrow 155).

The alignment assembly 151 may include or be accompanied by a guide set 157. The guide set 157 may include at least one guide member 159 (e.g., alongside and/or adjacent the coolant connector 117) and at least one guide receiver 161 (e.g., alongside and/or adjacent the port body 139). In use, a given guide member 159 may engage a given guide receiver 161 to impart movement toward radial alignment of the coolant connector 117 with the port body 139. Alignment may be facilitated by predetermined distances between components, such as the guide receiver 161 and the port body 139 being spaced apart by a predetermined distance and/or the guide member 159 and the coolant connector 117 being spaced apart by a predetermined distance.

Any suitable form of structure may be utilized in the guide set 157. For example, although the guide member 159 is depicted as a guide socket while the guide receiver 161 is depicted as a guide pin to be received in the guide socket, the guide member 159 may include a pin, the guide receiver 161 may include a socket, and/or other combinations of protrusions, receiving receptacles, and/or other structures may be utilized.

Any suitable number of guide members 159 and receivers 161 may be utilized in the guide set 157. The guide set 157 is shown with two each of the guide member 159 and guide receiver 161 (e.g., which may provide alignment and/or correct misalignment in a yaw direction corresponding to rotation about a vertical axis), although any number of one, two, or more than two may be utilized.

The alignment assembly 151 can include and/or be implemented with various components. Some examples are discussed further with respect to FIG. 3.

Figure 3:
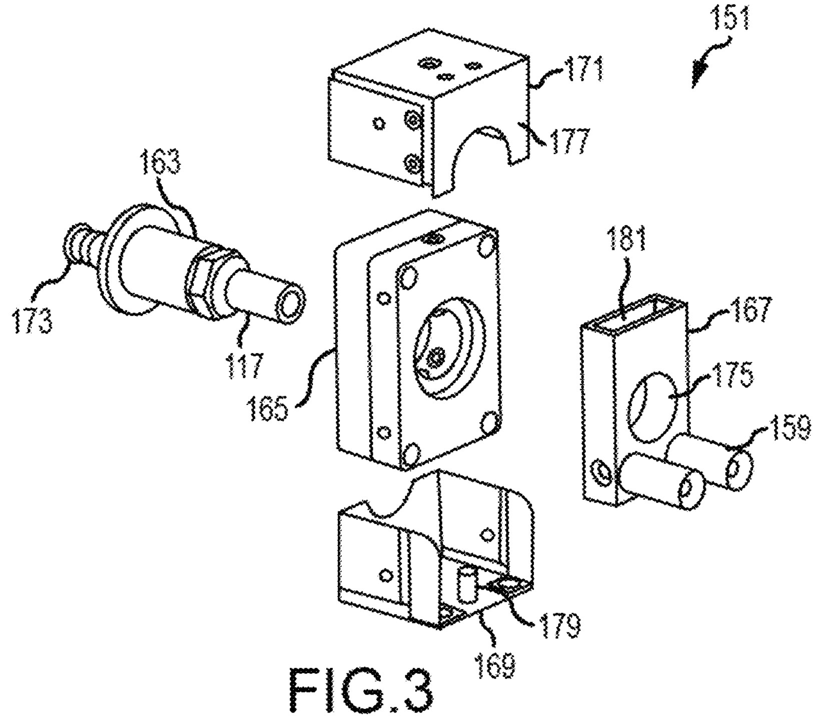
FIG. 3 illustrates an exploded view of an assembly that may be used among the components of FIG. 2 according to various embodiments.

FIG. 3 illustrates an exploded view of the alignment assembly 151 and accompanying components. FIG. 3 shows an adapter 163, a housing 165, a guide block 167, a base 169, and a cap 171, although more, fewer, or different components may be included.

The adapter 163 can include a cylindrical body. The cylindrical body may be connected at a distal end with a fitting 173 and at a proximal end with a coolant connector 117. The fitting 173 may be configured to be connectible with the coolant conduit 111. The coolant connector 117 may be configured to be releasably connectible with the coolant manifold 147, such as via the port body 139.

The housing 165 may include a through-passage sized for receiving the adapter 163. For example, the housing 165 may be sized such that the adapter 163 may extend through the housing 165 in a position in which the fitting 173 and the coolant connector 117 are disposed on opposite sides of the housing 165.

The guide block 167 may be movable relative to the housing 165. The guide block 167 may include a bore 175. The bore 175 may be sized for being received on the adapter 163, for example. The guide block 167 further may include the guide member 159.

The base 169 may be suitably sized and/or shaped for supporting other components. The base 169 may be included in or coupled with the chassis 103. The base 169 may be sized to receive the housing 165 and/or the guide block 167 in use, for example.

The base 169 and/or the cap 171 may be suitably sized and/or shaped for constraining other components. As one example, the base 169 and/or the cap 171 may be sized to constrain axial movement of the guide block 167 relative to the housing 165. For example, both the housing 165 and the guide block 167 may be sized with respective footprints that fit together within a footprint of the base 169 and/or the cap 171. The base 169 and/or the cap 171 may include at least one vertical wall 177 that may form an outer boundary against movement. Additionally or alternatively, the base 169 and/or the cap 171 may include a peg 179 that may project into a recess 181 or other hollow area along a top, bottom, or lateral side of the guide block 167 or housing 165 to function as an internal impediment to movement or otherwise constrain to a particular movement path, the base 169 and/or the cap 171 may be arranged to substantially limit movement in an axial direction while permitting the guide block 167 to be movable in radial displacement or float in use.

The housing 165 can include components that may facilitate radial alignment. Some examples are discussed further with respect to FIG. 4.

Figure 4:
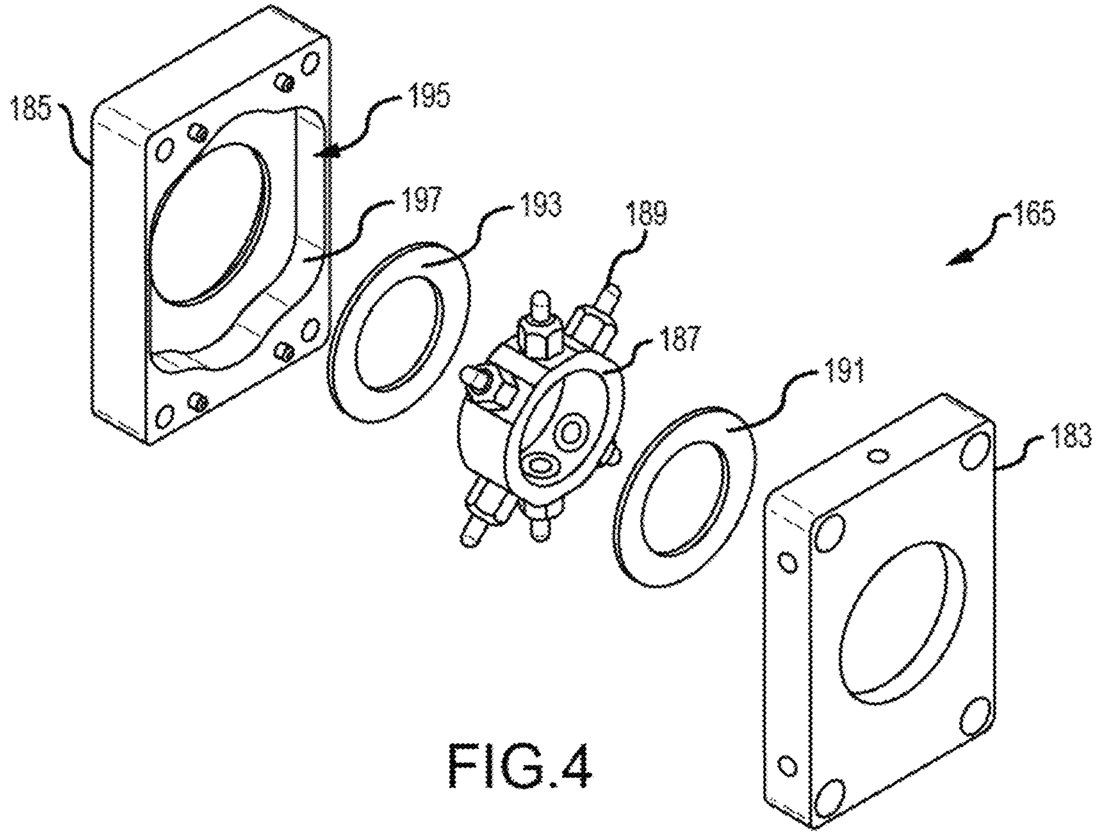
FIG. 4 illustrates an exploded view of a housing and associated components that may be used in the assembly of FIG. 3 according to various embodiments.

FIG. 4 illustrates an exploded view of the housing 165 and accompanying components. FIG. 4 shows a first or front part 183, a second or rear part 185, a collar 187, a set of biasing members 189, a front gasket 191, and a rear gasket 193, although more, fewer, or different components may be included.

The front part 183 and the rear part 185 of the housing 165 can be joined together to form a cavity 195. Forming the housing 165 in a multiple part construction may facilitate assembly of the housing 165 to include or contain other components in use. The cavity 195 may be sized for containing the set of biasing members 189 and the collar 187. The cavity 195 may have boundaries that include landing surfaces 197. The landing surfaces 197 may face toward the cavity 195 and may extend substantially parallel to a longitudinal axis of the housing 165.

When assembled, the front gasket 191 may function as a sealing member and/or a bearing member between a front of the collar 187 and the front part 183 of the housing 165, while the rear gasket 193 may function as a sealing member and/or a bearing member between a rear of the collar 187 and the rear part 185 of the housing 165. Overall, the front part 183 and the rear part 185 of the housing 165 when assembled may sandwich the collar 187 to substantially limit movement in an axial direction while permitting the collar 187 to be movable in radial displacement or float in use. An example of an assembled position of the collar 187 and other components may be seen in FIG. 5.

Figure 5:
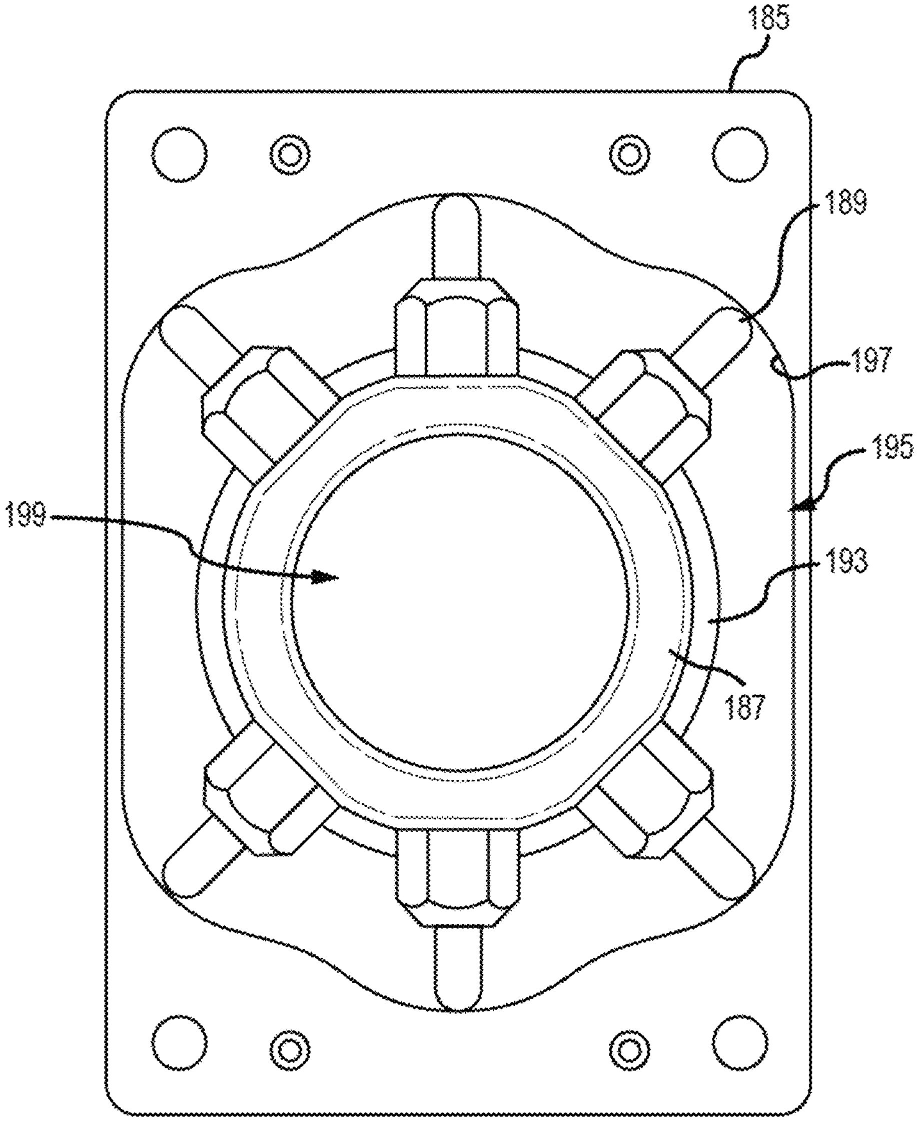
FIG. 5 illustrates components from FIG. 4 in an assembled state according to various embodiments.

FIG. 5 illustrates various components from FIG. 4 in an assembled state. FIG. 5 by way of example shows that the landing surfaces 197 of the cavity 195 may be arranged for receiving the biasing members 189 in an installed configuration in which the biasing members 189 press against the landing surfaces 197 and impart biasing forces directed at least partially radially toward the collar 187. For example, the biasing members 189 may impart forces that include vertical and/or horizontal components that are oriented toward an interior of the collar 187. The biasing members 189 are depicted as spring-loaded retractable plungers but may correspond to other suitable biasing mechanisms in use.

The biasing members 189 may provide a centering effect for the collar 187. The biasing members 189 may function to impart a smoother movement of the collar 187 than if the biasing members 189 were absent.

The biasing members 189 may permit the collar 187 to travel in differing radial directions in response to radial movement of structure received in a central lumen 199 of the collar 187. For example, when the adapter 163 (FIG. 3) is received in the central lumen 199 of the collar 187 (e.g., in a direction into or out of the page) and subject to a force oriented in the downward direction in the view in FIG. 5, the biasing members 189 along the bottom of the collar 187 may compress while the biasing members 189 along the top of the collar 187 may expand to accommodate the downward deflection. Continuing this example, upon cessation of the downward force, the biasing members 189 may collectively return toward equilibrium to re-center the lumen 199 of the collar 187. Similarly, if a leftward force is applied from the lumen 199, the biasing members 189 along the left of the collar 187 may compress while the biasing members 189 along the right may expand to accommodate the leftward deflection (and upon cessation of the leftward force, the lumen 199 of the collar 187 may be urged toward center by the biasing members 189).

The biasing members 189 can include at least three distributed along the outer circumference of the collar 187. Including at least three can enable vertical and horizontal components of forces to be absorbed by the biasing members 189 and avoid a possibility of forces being aligned completely normal to all biasing members 189. In FIG. 5, six total biasing members 189 are shown (e.g., with three distributed along an upper portion of the collar 187 and three distributed along a lower portion of the collar 187, which may be suitable to withstand a wide variety of loading conditions), although three, four, five, six, or more than six may be utilized.

Figure 6:
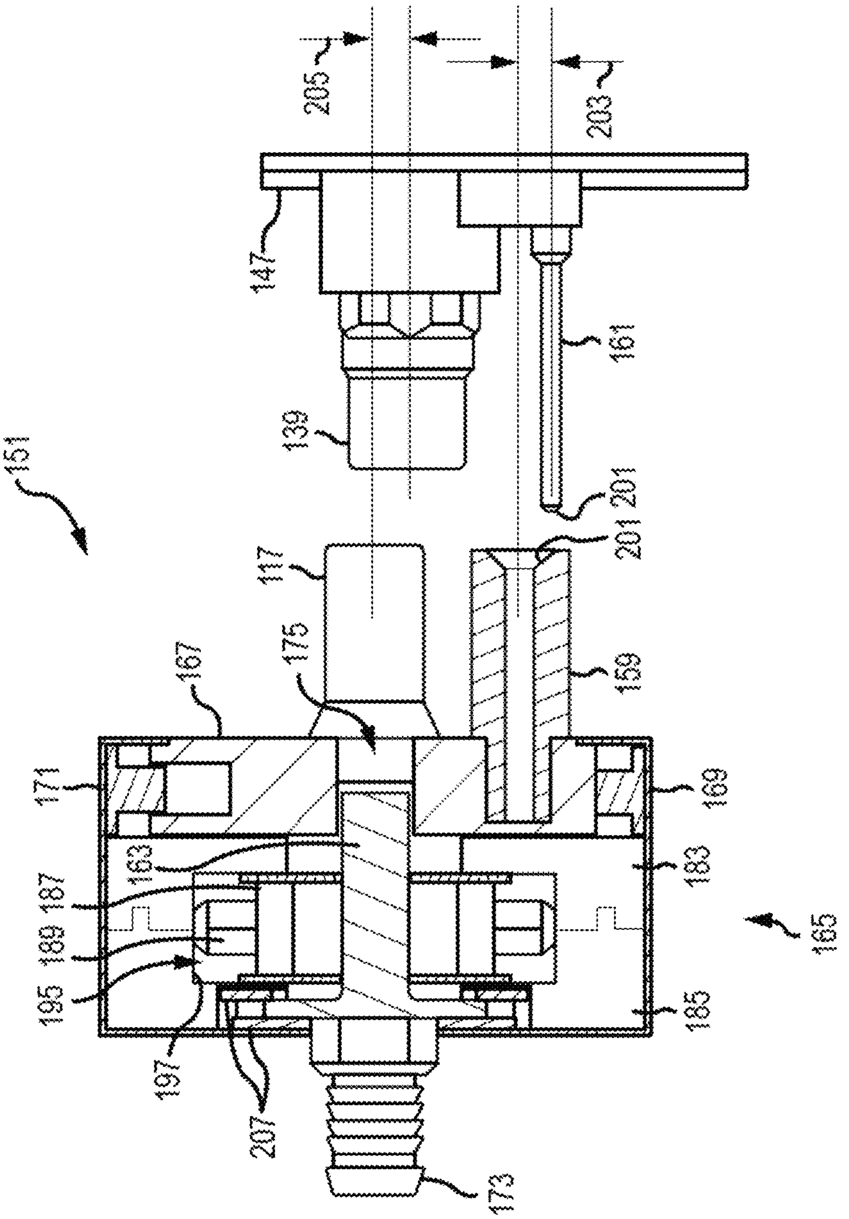
FIG. 6 illustrates a side view of components that may be aligned in use according to various embodiments.

FIG. 6 illustrates a side view of components assembled for facilitating alignment in use. FIG. 6 shows the cylindrical body of the adapter 163 in a received position in the collar 187. In the depicted received position, the fitting 173 of the adapter 163 and the coolant connector 117 of the adapter 163 are arranged extending away from opposite sides of the collar 187. The internal cavity 195 (e.g., formed by the front part 183 and the rear part 185) of the housing 165 is shown containing the collar 187 and the set of biasing members 189. The landing surfaces 197 of the internal cavity 195 are shown receiving the biasing members 189 in an installed configuration in which the biasing members 189 press against the landing surfaces 197 and impart biasing forces directed at least partially radially toward the collar 187. The adapter 163 in the depicted received position is also shown received in the bore 175 of the guide block 167. As a result of the adapter 163 being received in both the guide block 167 and the collar 187, all three parts (the adapter 163, collar 187, and guide block 167) may move together in use. The guide member 159 may extend beyond a length of the coolant connector 117, e.g., such that the guide member 159 will engage other structure before the coolant connector 117 during axial translation.

At least one tapered surface 201 may be included to facilitate alignment, such as included in and/or on the guide member 159 and/or the guide receiver 161. The at least one tapered surface 201 may be engageable by axial translation to cause radial translation of at least some components within the alignment assembly 151. As an illustrative example depicted in FIG. 6, the alignment assembly 151 may be moved toward the coolant manifold 147, e.g., along an axial direction that may correspond to a rightward direction in FIG. 6. (Such movement may be a result of moving components discussed with reference to FIG. 1, such as moving the chassis 103 into a seated configuration in the rack 101.) As the alignment assembly 151 is moved toward the coolant manifold 147 in an axial direction, the guide member 159 and the guide receiver 161 may come into contact with one another and impart a radial translation of features of the alignment assembly 151, e.g., in response to travel along the at least one tapered surface 201 in the axial direction. For example, the guide member 159 may be displaced in a radial direction by a displacement distance 203 in response to travel in the axial direction. This in turn may cause a similar displacement distance 205 for the coolant connector 117, which may align the coolant connector 117 for engagement with the port body 139. For example, with the various parts coupled to move together, radial displacement of the guide member 159 may accordingly cause radial displacement of the guide block 167, the adapter 163 (e.g., with the coolant connector 117), and the collar 187. Radial movement of the collar 187 may be counter to at least some of the biasing members 189, e.g., which may facilitate smooth movement toward engagement and/or re-centering upon disengagement of the coolant connector 117 relative to the port body 139. Overall, the radial displacement may allow or correspond to correcting radial misalignment of the coolant connector 117 relative to the coolant manifold 147. In various embodiments, accompanying components may allow the coolant connector 117 to be capable of a radial displacement distance 205 of up to 4 mm in any single radial direction (e.g., which may be useful to accommodate positioning variations that may occur due to stacking of manufacturing tolerances within the system 105), although other amounts of float or displacement may be accomplished.

Although the radial displacement is represented as a vertical component in the depiction on account of FIG. 6 being a side view, the radial displacement additionally or alternatively may include a horizontal component (e.g., a displacement into or out of the page). For example, the tapered surface 201 may correspond to a radially tapered surface, such as a conical or frustoconical surface, e.g., such that horizontal and/or vertical radial displacement may be achieved. An example of a conical or frustoconical surface may be appreciated with respect to portions of the guide member 159 and guide receiver 161 shown in FIG. 2.

FIG. 6 also shows relative arrangement of components relative to the alignment assembly 151 that may facilitate limiting and/or permitting various movements. For example, the base 169 and cap 171 are shown containing the front part 183 and rear part 185 coupled together. The base 169 and cap 171 are also each shown constraining the guide block 167 to remain adjacent the housing 165 in the axial direction and thus in suitable position for receipt of the adapter 163 while also allowing radial movement of the guide block 167. Suitable washers 207 may be included and may have suitably sized inner and/or outer diameters that may differ or match outer diameters of the adapter and/or inner diameters of the housing to allow and/or facilitate relative movement, e.g., to provide a suitable friction characteristic along movement locations and/or to provide sealing against liquid passage.

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms “a” and “an” and “the” and similar referents in the context of describing the disclosed embodiments (especially in the context of the following claims) are to be construed to cover both the singular and the plural, unless otherwise indicated herein or clearly contradicted by context. The terms “comprising,” “having,” “including,” and “containing” are to be construed as open-ended terms (i.e., meaning “including, but not limited to,”) unless otherwise noted. The term “connected” is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A system, comprising:
- a rack;
- a chassis slidingly received in the rack;
- a server component borne by the chassis;
- a coolant manifold coupled with the rack and including a port body and a guide pin spaced a predetermined distance from the port body;
- a conduit arranged in the chassis to convey coolant for cooling the server component; and
- an alignment assembly borne by the chassis and arranged between, and configured to facilitate alignment between, the conduit and the coolant manifold, the alignment assembly comprising:
  - an adapter comprising a cylindrical body connected at a distal end with a fitting and at a proximal end with a coolant connector, wherein the fitting is connected with the conduit, and wherein the coolant connector is releasably connectible with the port body of the coolant manifold;
  - a collar in which the cylindrical body is received;
  - a set of biasing members distributed along an outer circumference of the collar and oriented to impart biasing forces directed radially toward the collar;
  - a housing containing the collar and the set of biasing members; and
  - a guide block having a bore received on the adapter, the guide block further comprising a guide socket having a tapered surface translatable axially toward the guide pin to engage the guide pin and cause radial translation of the collar and the adapter counter to at least some of the biasing members to correct radial misalignment of the coolant connector relative to the port body of the coolant manifold.

2. The system of claim 1, wherein the set of biasing members comprises six biasing members.

3. The system of claim 1, wherein the housing comprises a front part and a rear part joined together to form a cavity sized for containing the set of biasing members and the collar.

4. The system of claim 1, wherein the alignment assembly further comprises at least one of a base or a cap sized to constrain axial movement of the guide block relative to the housing.

5. A system, comprising:
- an alignment assembly configured to be borne by a rack-mountable chassis in a position arranged to facilitate alignment between a conduit and a coolant manifold, the alignment assembly comprising:
  - an adapter comprising a cylindrical body connected at a distal end with a fitting and at a proximal end with a coolant connector, wherein the fitting is connectible with the conduit, and wherein the coolant connector is releasably connectible with the coolant manifold;
  - a collar in which the cylindrical body is received;
  - a set of biasing members distributed along an outer circumference of the collar and oriented to impart biasing forces directed radially toward the collar;
  - a housing containing the collar and the set of biasing members; and
  - a guide block having a bore received on the adapter, the guide block further comprising a tapered surface configured to be engaged by axial translation so as to cause radial translation of the collar and the adapter counter to at least some of the biasing members to move toward radial alignment of the coolant connector with the coolant manifold.

6. The system of claim 5, further comprising at least one of the chassis, the conduit, or the coolant manifold.

7. The system of claim 5, wherein the set of biasing members comprises at least three biasing members distributed along the outer circumference of the collar.

8. The system of claim 5, wherein the set of biasing members comprises at least three biasing members distributed along an upper portion of the collar and at least three biasing members distributed along a lower portion of the collar.

9. The system of claim 5, wherein the guide block comprises a first guide member and a second guide member extending from the guide block beyond a length of the coolant connector.

10. The system of claim 5, wherein the guide block comprises a guide member that includes the tapered surface.

11. The system of claim 10, wherein the guide member comprises a guide socket.

12. The system of claim 11, wherein the system further comprises:
- a rack;
- the rack-mountable chassis, wherein the chassis is slidingly received in the rack;
- an electronic component borne by the chassis;
- the coolant manifold, wherein the coolant manifold is coupled with the rack and includes a port body and a guide pin spaced a predetermined distance from the port body; and
- the conduit, wherein the conduit is arranged in the chassis to convey coolant for cooling the electronic component;
- wherein the tapered surface is translatable axially toward the guide pin to engage the guide pin and cause radial translation of the collar and the adapter counter to at least some of the biasing members to correct radial misalignment of the coolant connector relative to the port body of the coolant manifold.

13. A system, comprising:

an alignment assembly configured to be implemented relative to a rack-mountable chassis, the alignment assembly comprising:

a collar sized to receive a cylindrical body of an adapter in a received position in which a fitting of the adapter and a coolant connector of the adapter are arranged extending away from opposite sides of the collar;

a set of biasing members;

a housing defining an internal cavity sized for containing the collar and the set of biasing members, the internal cavity having landing surfaces arranged for receiving the biasing members in an installed configuration in which the biasing members press against the landing surfaces and impart biasing forces directed at least partially radially toward the collar; and a guide block moveable relative the housing and having a bore sized for being received on the adapter in the received position, the guide block further comprising a tapered surface engageable by axial translation to cause radial translation of the collar counter to at least some of the biasing members.

14. The system of claim 13, further comprising the adapter.

15. The system of claim 13, further comprising the rack-mountable chassis.

16. The system of claim 13, further comprising a conduit and a coolant manifold, wherein the fitting is connectible with the conduit, and wherein the coolant connector is releasably connectible with the coolant manifold.

17. The system of claim 13, further comprising a cap and a base arranged to maintain the guide block adjacent the housing in an axial direction while permitting radial movement of the guide block relative to the axial direction.

18. The system of claim 13, wherein the housing comprises a first part and a second part joined together to form the cavity.

19. The system of claim 13, wherein the alignment assembly is configured to be borne by the rack-mountable chassis in a position arranged to facilitate alignment between a conduit and a coolant manifold;

wherein the system further comprises the adapter and the adapter comprises the cylindrical body connected at a distal end with the fitting and at a proximal end with the coolant connector;

wherein the fitting is connectible with the conduit;

wherein the coolant connector is releasably connectible with the coolant manifold;

wherein the cylindrical body is received in the collar;

wherein the set of biasing members are distributed along an outer circumference of the collar and oriented to impart biasing forces directed radially toward the collar; and wherein the tapered surface is configured to be engaged by axial translation so as to cause radial translation of the collar and the adapter counter to at least some of the biasing members to move toward radial alignment of the coolant connector with the coolant manifold.

20. The system of claim 19, wherein the system further comprises:

a rack;

the rack-mountable chassis, wherein the chassis is slidingly received in the rack;

an electronic component borne by the chassis;

the coolant manifold, wherein the coolant manifold is coupled with the rack and includes a port body and a guide pin spaced a predetermined distance from the port body; and the conduit, wherein the conduit is arranged in the chassis to convey coolant for cooling the electronic component;

wherein the tapered surface is translatable axially toward the guide pin to engage the guide pin and cause radial translation of the collar and the adapter counter to at least some of the biasing members to correct radial misalignment of the coolant connector relative to the port body of the coolant manifold.

* * * * *